US012622210B2

(12) United States Patent
Maleev et al.

(10) Patent No.: US 12,622,210 B2
(45) Date of Patent: May 5, 2026

(54) METROLOGY INTEGRATED WITH VACUUM PROCESSING

(71) Applicant: Tokyo Electron Limited, Tokyo (JP)

(72) Inventors: Ivan Maleev, Fremont, CA (US);
Basanta Bhaduri, Fremont, CA (US);
Holger Tuitje, Fremont, CA (US);
Mihail Mihaylov, Fremont, CA (US);
Xinkang Tian, Fremont, CA (US); **Da
Song**, Albany, NY (US)

(73) Assignee: Tokyo Electron Limited, Tokyo (JP)

( * ) Notice: Subject to any disclaimer, the term of this
patent is extended or adjusted under 35
U.S.C. 154(b) by 256 days.

(21) Appl. No.: 18/478,946

(22) Filed: Sep. 29, 2023

(65) Prior Publication Data
US 2025/0112065 A1 Apr. 3, 2025

(51) Int. Cl.
*H01L 21/67* (2006.01)
*G01N 21/84* (2006.01)
*H01L 21/66* (2006.01)

(52) U.S. Cl.
CPC ....... *H01L 21/67253* (2013.01); *G01N 21/84*
(2013.01); *H01L 22/26* (2013.01);
(Continued)

(58) Field of Classification Search
CPC ... H01L 21/67253; H01L 22/26; G01N 21/84;
G01N 2201/025; G01N 2201/0638; G01N
21/9501
(Continued)

(56) References Cited

U.S. PATENT DOCUMENTS 5,032,734 A * 7/1991 Orazio, Jr. ......... G01N 21/9501
250/559.46
5,517,312 A * 5/1996 Finarov ................ G01B 11/065
356/630
(Continued)

FOREIGN PATENT DOCUMENTS

CN 109881251 A 6/2019
JP 3773355 B2 5/2006

OTHER PUBLICATIONS

International Search Report and Written Opinion issued Nov. 12,
2024 in PCT/US2024/039741, 10 pgs.

*Primary Examiner* — Isiaka O Akanbi
(74) *Attorney, Agent, or Firm* — Oblon, McClelland,
Maier & Neustadt, L.L.P.

(57) ABSTRACT
A system includes a vacuum chamber having a wafer chuck
therein and side windows slanted relative to the wafer chuck.
A wafer stage is positioned below the wafer chuck and
configured to rotate the wafer chuck and move the wafer
chuck vertically. Illumination optics, including an illumina-
tion corrector lens, are configured to receive light and direct
the light through an illumination vacuum window of the side
windows to an optical spot on the wafer. Collection optics,
including a collection corrector lens, are configured to
receive the light from the optical spot through a collection
vacuum window of the side windows and direct the light to
a detector. A transfer module is configured to move the
illumination optics and the collection optics parallel to the
illumination vacuum window and the collection vacuum
window respectively. The illumination corrector lens and the
collection corrector lens are configured to reduce chromatic
aberration.

20 Claims, 5 Drawing Sheets

(52) U.S. Cl.
CPC .................. *G01N 2201/025* (2013.01); *G01N 2201/0638* (2013.01)

(58) Field of Classification Search
USPC ............................ 356/445–446, 237.2–237.6
See application file for complete search history.

(56) References Cited

U.S. PATENT DOCUMENTS

| | | | |
|---|---|---|---|
| 5,742,389 A * | 4/1998 | Zavislan ................... | G01J 3/02 |
| | | | 356/326 |
| 5,924,058 A | 7/1999 | Waldhauer et al. | |
| 6,335,532 B1 | 1/2002 | Tanaka et al. | |
| 6,559,459 B2 | 5/2003 | Tanaka et al. | |
| 6,744,057 B2 | 6/2004 | Tanaka et al. | |
| 6,885,012 B2 | 4/2005 | Tanaka et al. | |
| 7,120,228 B2 | 10/2006 | Yokhin et al. | |
| 7,551,719 B2 | 6/2009 | Yokhin et al. | |
| 7,832,353 B2 | 11/2010 | Takizawa et al. | |
| 9,816,946 B2 | 11/2017 | Stegmann | |
| 10,388,549 B2 | 8/2019 | Paul et al. | |
| 10,431,480 B2 | 10/2019 | Nguyen et al. | |
| 10,727,057 B2 | 7/2020 | Clark et al. | |
| 10,784,175 B2 | 9/2020 | Clark | |
| 10,861,744 B2 | 12/2020 | Trickett et al. | |
| 10,886,173 B2 | 1/2021 | Clark et al. | |
| 10,916,472 B2 | 2/2021 | Clark et al. | |
| 10,923,394 B2 | 2/2021 | Clark et al. | |
| 10,964,608 B2 | 3/2021 | Clark | |
| 11,101,173 B2 | 8/2021 | Clark et al. | |
| 11,152,268 B2 | 10/2021 | Clark et al. | |
| 11,264,254 B2 | 3/2022 | Tapily et al. | |
| 11,302,588 B2 | 4/2022 | Clark et al. | |
| 2002/0053643 A1 * | 5/2002 | Tanaka .................... | H01J 37/21 |
| | | | 250/492.2 |
| 2003/0020904 A1 * | 1/2003 | Uto ................... | G01N 21/95607 |
| | | | 356/237.2 |
| 2006/0062350 A1 * | 3/2006 | Yokhin ............ | G01N 23/20008 |
| | | | 378/86 |
| 2007/0196011 A1 | 8/2007 | Cox et al. | |
| 2013/0213945 A1 * | 8/2013 | Stegmann .............. | G01N 23/04 |
| | | | 219/121.83 |
| 2013/0241587 A1 * | 9/2013 | Chua ........................ | G01R 1/04 |
| | | | 324/756.01 |
| 2013/0277553 A1 * | 10/2013 | Otani ................. | G01N 21/8806 |
| | | | 250/306 |
| 2015/0022806 A1 * | 1/2015 | Shibata ................ | G01N 21/958 |
| | | | 356/237.4 |
| 2016/0011123 A1 * | 1/2016 | Shibata .................... | G06T 7/32 |
| | | | 356/237.5 |
| 2016/0077025 A1 | 3/2016 | Zhang et al. | |
| 2016/0181135 A1 | 6/2016 | Buonodono | |
| 2016/0341544 A1 | 11/2016 | Foad | |
| 2017/0148654 A1 | 5/2017 | Paul et al. | |
| 2017/0178933 A1 | 6/2017 | Ferrara et al. | |
| 2018/0286643 A1 * | 10/2018 | Tuitje .................... | G01N 21/31 |
| 2019/0295906 A1 | 9/2019 | Clark et al. | |
| 2020/0006100 A1 | 1/2020 | Clark et al. | |
| 2020/0043764 A1 | 2/2020 | Clark et al. | |
| 2020/0083070 A1 | 3/2020 | Clark et al. | |
| 2020/0083080 A1 | 3/2020 | Clark et al. | |
| 2021/0118730 A1 | 4/2021 | Clark et al. | |
| 2021/0125863 A1 | 4/2021 | Clark et al. | |
| 2022/0404143 A1 * | 12/2022 | Pandev .............. | G03F 7/70633 |
| 2025/0164410 A1 * | 5/2025 | Tuitje ................. | G01N 21/956 |

\* cited by examiner

100

400

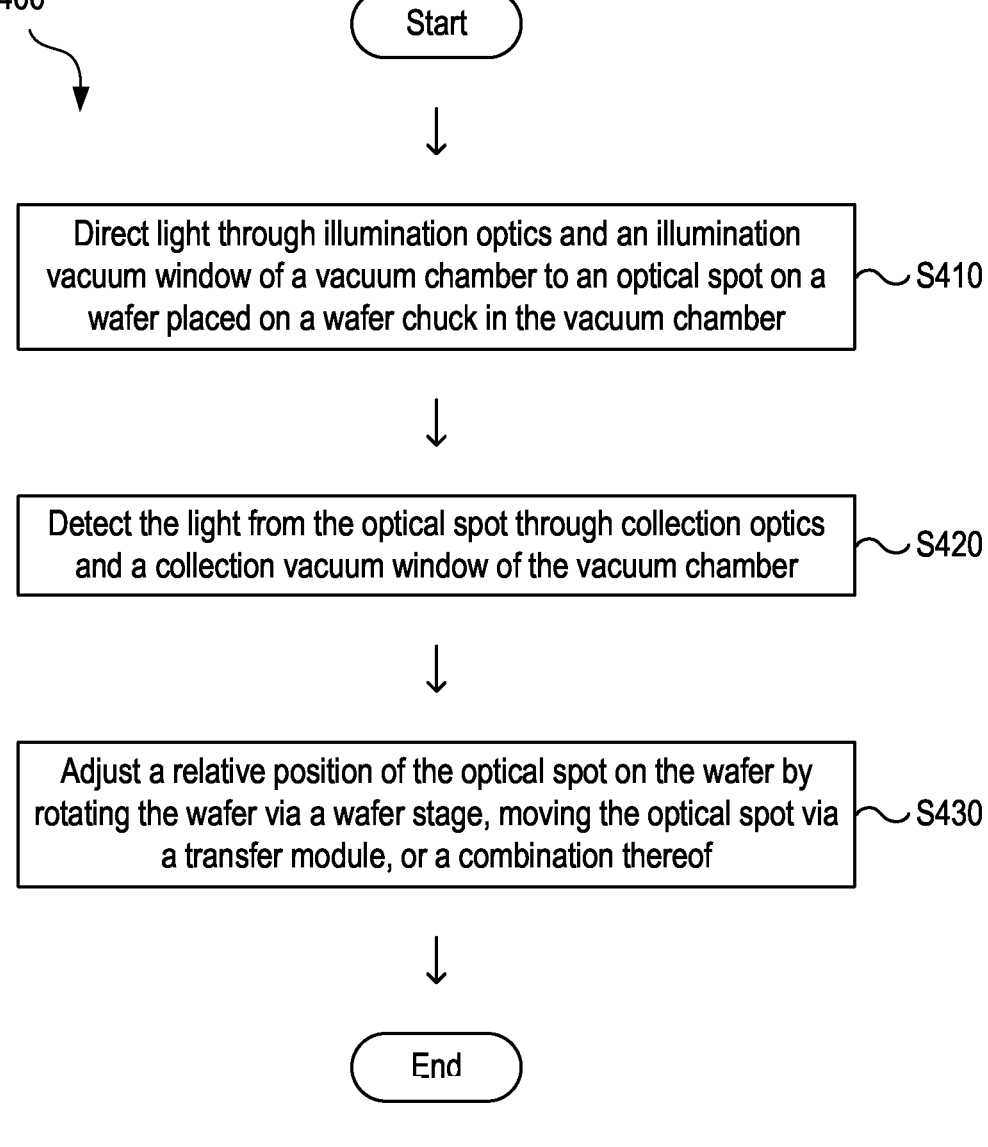

Start

↓

Direct light through illumination optics and an illumination vacuum window of a vacuum chamber to an optical spot on a wafer placed on a wafer chuck in the vacuum chamber ～S410

↓

Detect the light from the optical spot through collection optics and a collection vacuum window of the vacuum chamber ～S420

↓

Adjust a relative position of the optical spot on the wafer by rotating the wafer via a wafer stage, moving the optical spot via a transfer module, or a combination thereof ～S430

↓

End

Figure 4

METROLOGY INTEGRATED WITH VACUUM PROCESSING

FIELD OF THE INVENTION

This disclosure relates generally to semiconductor processing and more specifically to wafer characterization and a system configured to perform wafer metrology.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate and are typically performed in a vacuum environment.

SUMMARY

The present disclosure relates to a method of wafer characterization and a system configured to characterize a wafer.

According to a first aspect of the disclosure, a system is provided. The system includes a vacuum chamber having a wafer chuck therein and side windows slanted relative to the wafer chuck. The wafer chuck is configured to receive a wafer. The system also includes a wafer stage positioned below and mechanically coupled to the wafer chuck. The wafer stage is configured to rotate the wafer chuck and move the wafer chuck in a vertical direction substantially perpendicular to the wafer chuck. The system further includes illumination optics configured to receive light from a light source and direct the light through an illumination vacuum window of the side windows to an optical spot on the wafer. The illumination optics include an illumination corrector lens. The system further includes collection optics configured to receive the light from the optical spot through a collection vacuum window of the side windows and direct the light to a detector. The collection optics include a collection corrector lens. The system further includes a transfer module configured to move the illumination optics and the collection optics parallel to the illumination vacuum window and the collection vacuum window respectively. The illumination corrector lens and the collection corrector lens are configured to reduce optical aberration.

In some embodiments, the wafer stage is outside the vacuum chamber.

In some embodiments, the system further includes a journal bearing that mechanically connects the wafer stage to the wafer chuck and extends through a bottom portion of the vacuum chamber with a vacuum seal.

In some embodiments, the wafer stage is inside the vacuum chamber.

In some embodiments, the wafer stage is configured to rotate the wafer chuck and move the wafer chuck in the vertical direction without moving the wafer in a horizontal direction parallel to the wafer chuck.

In some embodiments, the illumination optics and the collection optics are mounted on the transfer module that is configured to move the illumination optics and the collection optics simultaneously.

In some embodiments, the light source and the detector are mounted on the transfer module that is configured to move the light source, the detector, the illumination optics and the collection optics simultaneously.

In some embodiments, the light source and the detector are separate from the transfer module and configured to be stationary when the transfer module moves the illumination optics and the collection optics.

In some embodiments, the illumination optics and the collection optics are outside the vacuum chamber.

In some embodiments, the illumination corrector lens and the collection corrector lens are spaced apart from the vacuum chamber.

In some embodiments, the illumination optics further include a polarizer and an optical objective selected from the group consisting of a single aspheric mirror and a pair of off-axis spherical mirrors.

In some embodiments, the transfer module is configured to move the optical spot at least between an edge of the wafer and a center of the wafer.

In some embodiments, the system further includes a controller configured to adjust a relative position of the optical spot on the wafer by rotating the wafer via the wafer stage, moving the optical spot via the transfer module, or a combination thereof.

In some embodiments, the transfer module includes a stage on which the illumination optics and the collection optics are mounted, and the stage is configured to move parallel to a longitudinal direction of the side windows.

In some embodiments, the side windows are substantially perpendicular to an optical path of the light and substantially transparent to the light.

In some embodiments, the detector may be a spectrometer.

In some embodiments, the detector, the illumination optics and the collection optics are configured as an ellipsometer.

In some embodiments, the ellipsometer is configured as a spectroscopic ellipsometer having rotating polarizers.

In some embodiments, the system further includes a processing chamber connected to the vacuum chamber and configured to perform a surface treatment on the wafer in vacuum.

According to a second aspect of the disclosure, a method of wafer characterization is provided. The method includes directing light through illumination optics and an illumination vacuum window of a vacuum chamber to an optical spot on a wafer placed on a wafer chuck in the vacuum chamber. The illumination optics include an illumination corrector lens. The illumination vacuum window is slanted relative to the wafer chuck. The method also includes detecting the light from the optical spot through collection optics and a collection vacuum window of the vacuum chamber. The collection optics include a collection corrector lens. The collection vacuum window is slanted relative to the wafer chuck. The method further includes adjusting a relative position of the optical spot on the wafer by rotating the wafer via a wafer stage, moving the optical spot via a transfer module, or a combination thereof. The illumination corrector lens and the collection corrector lens are configured to reduce optical aberrations, including chromatic aberrations and monochromatic aberrations, such as astigmatism, coma, distortion, field curvature, spherical aberration, etc. The wafer stage is positioned below and mechanically coupled to the wafer chuck and configured to rotate the wafer chuck. The transfer module is configured to move the illumination optics and the collection optics parallel to the illumination vacuum window and the collection vacuum window respectively.

In some embodiments, the wafer stage, the illumination optics and the collection optics are outside the vacuum chamber.

In some embodiments, the wafer stage and the wafer chuck are mechanically connected via a journal bearing that extends through a bottom portion of the vacuum chamber with a vacuum seal.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

FIG. 4 shows a flow chart of a process for characterizing a wafer, in accordance with some embodiments of the present disclosure.

DETAILED DESCRIPTION

Figure 1A:
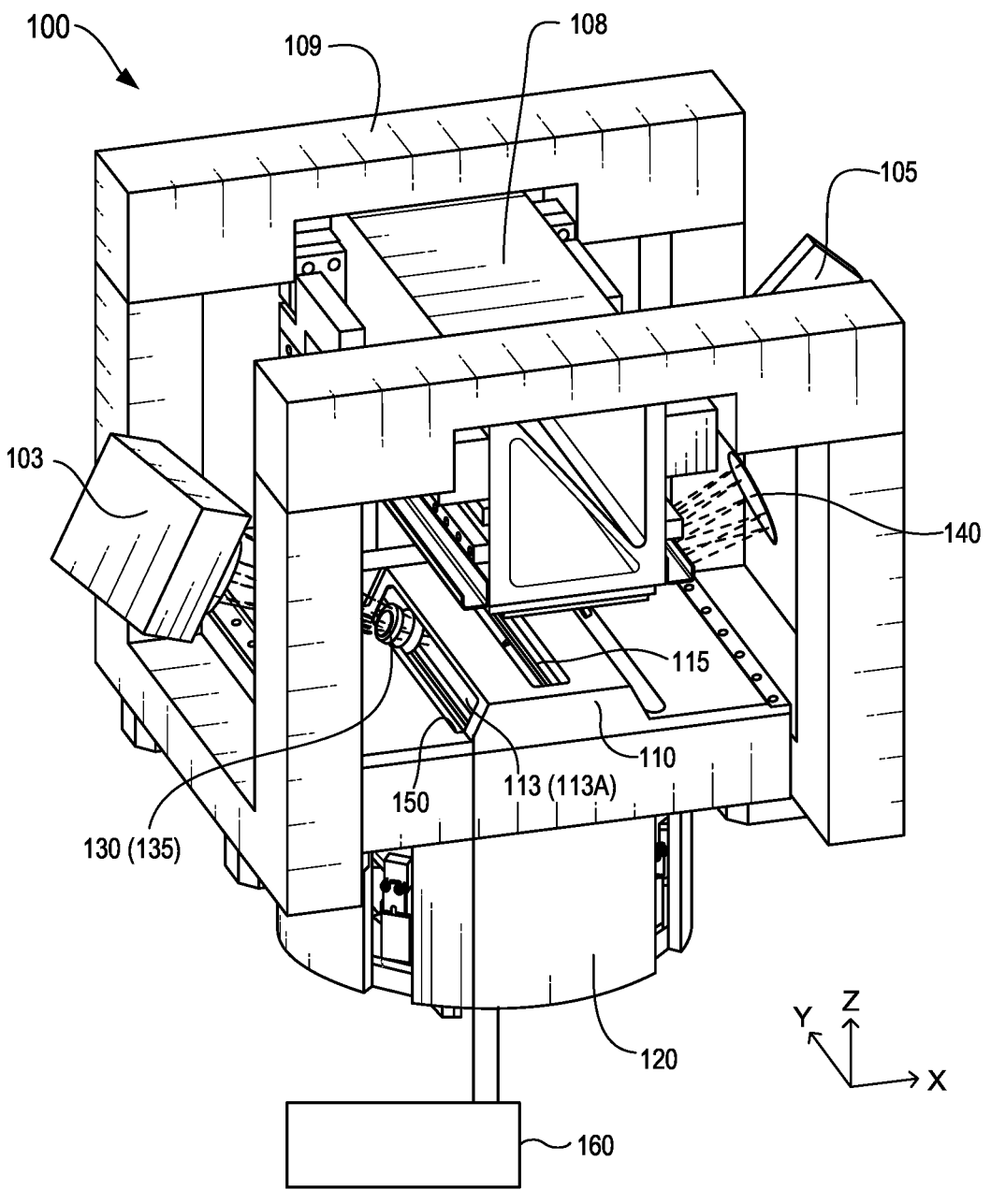
FIGS. 1A and 1B show perspective views of a system in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity's sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

In the drawings, like reference numerals designate identical or corresponding parts throughout the several views. Additionally, as used herein, the words "a", "an" and the like generally carry a meaning of "one or more", unless stated otherwise.

Furthermore, the terms, "approximately", "approximate", "about" and similar terms generally refer to ranges that include the identified value within a margin of 20%, 10%, or preferably 5%, and any values therebetween.

There is an unmet need for in-vacuum high-sensitivity metrology solution to measure thin films and patterned structures on semiconductor wafers during or after deposition, etching and other semiconductor processes. For example, when multiple films are deposited, it may be necessary to perform metrology measurements between deposition processes without breaking vacuum. Alternatively, during a single film layer deposition or etching process, it might be desirable to monitor or verify film thickness or semiconductor structure parameters for process end-point purposes. However taking a wafer out of the vacuum environment may result in quick oxidation of unprotected films in the air or contamination, and also take time. Furthermore, transitioning back and forth between different environments may change the wafer temperature.

At the same time, new semiconductor nodes bring new challenges to metrology. With film thicknesses dropping to a single nanometer and even angstrom levels, the metrology sensitivity requirements are tightening. For example, it might be necessary to measure nanometer-thick films with sub-angstrom sensitivity. Those requirements require capabilities, if available, previously reserved for stand-alone metrology tools, for example large angle-of-incidence (AOI) optical spectroscopic ellipsometers or similar configurations with the ability to measure polarization properties of samples.

Techniques herein include a large angle-of-incidence (e.g. AOI>60 degrees) optical apparatus capable of making broadband (e.g. 200-800 nm) ellipsometric measurements on thin films and semiconductor structures in vacuum. For example, this can be useful for deposition process control processes where it is necessary to measure a 10 nm thick film of TiN, SiN, or $SiO_2$ on Si substrate with sub-angstrom sensitivity.

According to some aspects of the present disclosure, a metrology subsystem of a processing tool can include a vacuum chamber with a chuck to hold a wafer on a rotational stage. An optical sensor can include a broadband illuminator as well as illumination and collection optics, allowing to send light into the vacuum chamber and onto a wafer sample, and then collect specular reflection from the wafer sample, and analyze it with a spectroscopic sensor such as a spectrometer. The vacuum chamber can have windows which are substantially transparent to incoming and reflected light over a desired range of wavelengths. The windows are mounted substantially perpendicular to the respective paths of illumination and collection beams. In some embodiments, a compact broadband illumination source, illumination optics, collection optics and a spectroscopic detector will be configured in a single compact assembly. Such an assembly may be mounted on a linear stage, which can transfer the entire optics assembly parallel to the windows over a range slightly larger than the wafer radius, and allow optics to sample wafer locations from center to edge. Combined with a rotation stage for the chuck and the wafer, the linear stage for the optics can provide one with the capability to measure any and all desired locations on the wafer.

Figure 1B:
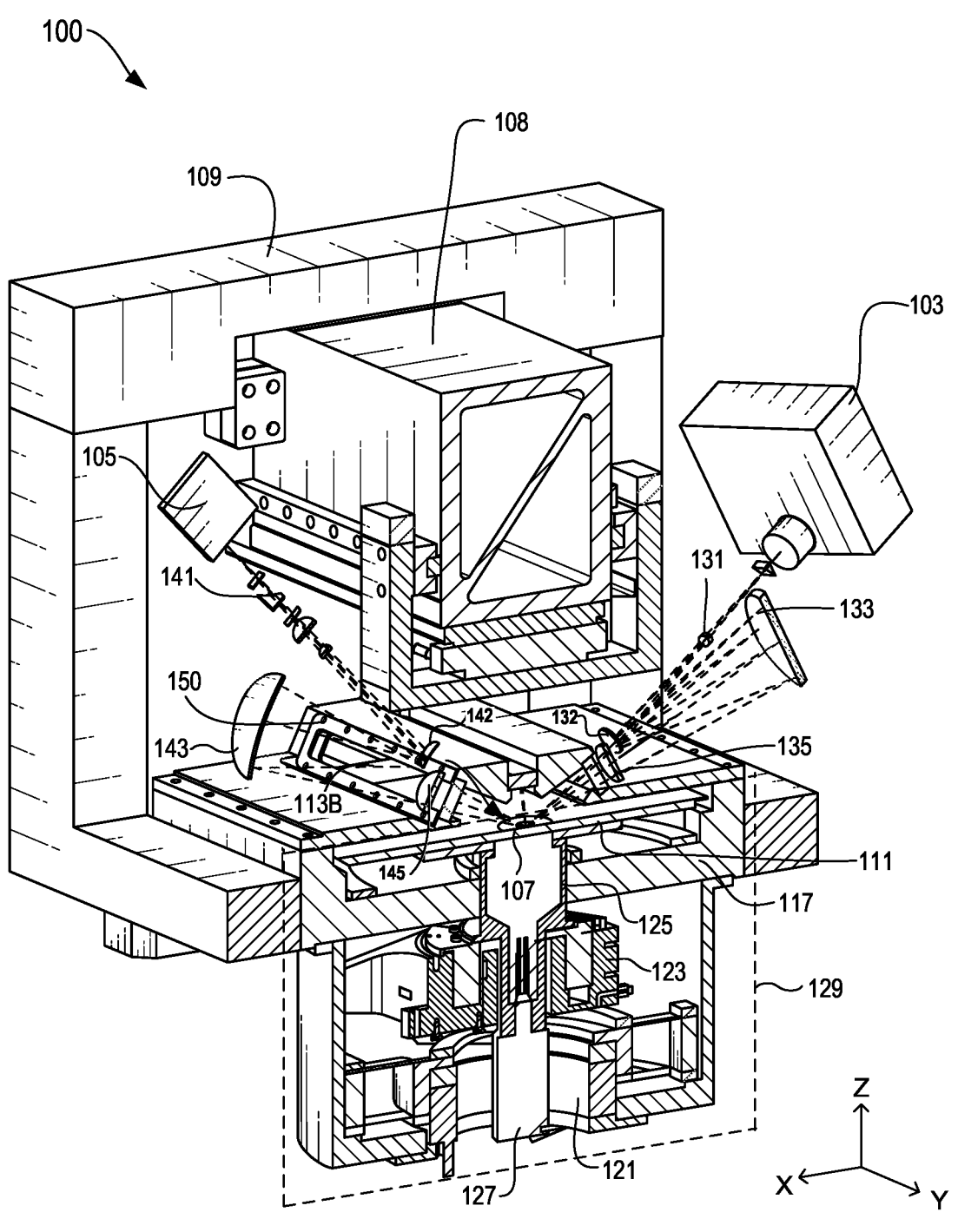
Figure 2:
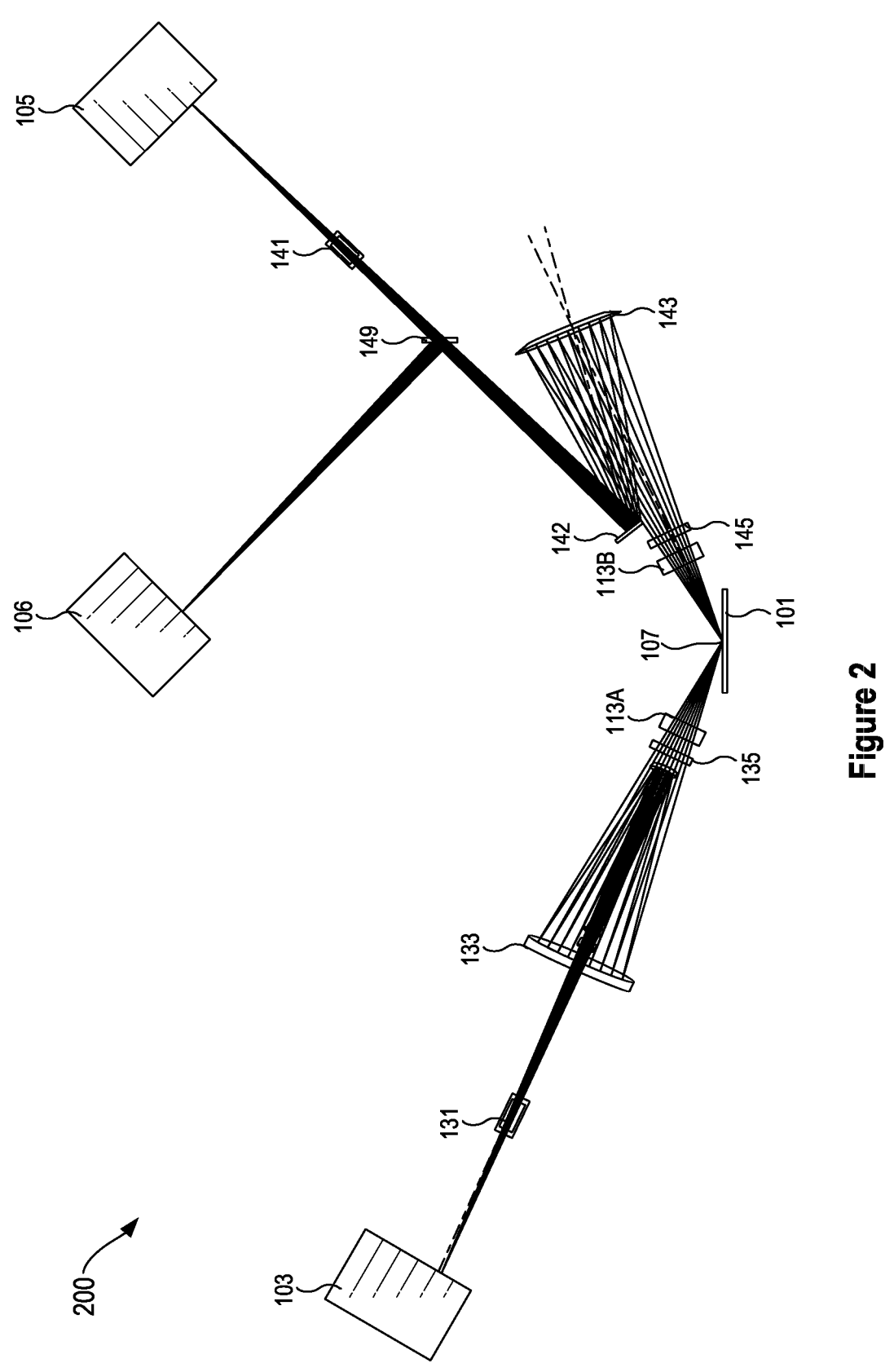
FIG. 2 show a schematic optical path of a system in accordance with some embodiments of the present disclosure.

FIGS. 1A and 1B show perspective views of a system 100, and FIG. 2 show a schematic optical path 200 of the system 100 in accordance with some embodiments of the present disclosure.

As illustrated, the system 100 includes a vacuum chamber 110 having a wafer chuck 111 therein and side windows 113 (e.g. 113A and 113B) slanted relative to the wafer chuck 111. The system 100 also includes a wafer stage 120 positioned below and mechanically coupled to the wafer chuck 111. The wafer stage 120 is configured to rotate the wafer chuck 111 and/or move the wafer chuck 111 in the Z direction as needed. The system 100 further includes an optical subsystem having, for example, illumination optics 130 and collection optics 140. The illumination optics 130 are configured to receive light from a light source 103 and direct the light through an illumination vacuum window 113A of the side windows 113 to an optical spot 107 on the wafer 101. The collection optics 140 are configured to receive the light from the optical spot 107 through a collection vacuum window 113B of the side windows 113 and direct the light to a detector 105. The system 100 further includes a transfer module 150 that is configured to move the illumination optics 130 and the collection optics 140 parallel to the illumination vacuum window 113A and the collection vacuum window 113B respectively.

In some embodiments, the wafer chuck 111 in the vacuum chamber 110 can be configured to receive a wafer 101. The wafer chuck 111 can include an electrostatic and edge-gripping chuck that is capable of holding a semiconductor wafer in vacuum, for example during chuck rotation. The vacuum chamber 110 can include a mechanical housing with one or more (e.g. two) openings so that the wafer 101 can be loaded and unloaded from one or more (e.g. two) sides of the vacuum chamber 110. For example, the wafer 101 may be loaded from one side, measured, and then picked up from an opposite side of the vacuum chamber 110. As a result, additional functions can be performed by a wafer transfer station.

While not shown, it should be understood that the vacuum chamber 110 can include a wafer lifting mechanism that is configured to lift the wafer 101 from the wafer chuck 111, for example with lift pins or an edge grip mechanism in order for the wafer handling robot arm/fork to move into the vacuum chamber 110 and place the wafer 101 on the wafer lifting mechanism for further placement of the wafer 101 on the wafer chuck 111, or remove the wafer 101 from the wafer lifting mechanism and out of the vacuum chamber 110.

The side windows 113 of the vacuum chamber 110 can include optically transparent windows configured for an illumination light from the optical subsystem to enter the vacuum chamber 110 and configured for reflected or scattered light to exit the vacuum chamber 110 for further detection and analysis. Identical, similar or additional optically transparent windows (e.g. 115) may be used for a wafer navigation camera and sensors (e.g. 108). For example, an X stage 108 can be configured to measure a wafer position of the wafer 101 inside the vacuum chamber 110 through a top window 115 of the vacuum chamber 110 with the accuracy on the order of 1 μm or less. Such optical windows (e.g. 113 and 115) may be designed to correct for chromatic and other optical aberrations and allow to make simultaneous measurements over a broadband range of wavelengths.

As the side windows 113 of the vacuum chamber 110 are slanted relative to the wafer chuck 111, the vacuum chamber 110 can have a trapezoid cross-section in the XZ plane. Each of the side windows can independently form an acute angle (e.g. 1°, 5°, 10°, 20°, 30°, 40°, 50°, 60°, 70°, 80°, 85°, 89° or any values therebetween) with the wafer chuck 111. The acute angle is preferably in a range of 30°-60°, preferably 35°-55°, preferably 40°-50°, preferably about 45°.

In some embodiments, the wafer stage 120 can be configured to rotate the wafer 101 and/or move the wafer 101 in the Z direction as needed. The wafer stage 120 can include a Z stage 121 and a T stage 123. The Z stage 121 can be mechanically connected to the T stage 123. The Z stage 121 is configured to move the wafer 101 in the Z direction. The T stage 123 is configured to rotate the wafer 101 via a rotary connector 127 and can include a high-precision rotational stage able to position the wafer 101 with an accuracy of 20 μrad or less. The rotary connector 127 can be connected to electrostatic chuck wires. That is, the rotary connector 127 can be connected to wires from and provide power to the (rotating) wafer chuck 111 while the other end of the rotary connector 127 is fixed.

Additionally, the system 100 can include a journal bearing 125 that mechanically connects the wafer stage 120 to the wafer chuck 111 and extends through a bottom portion 117 of the vacuum chamber 110 with a vacuum seal or another subassembly that allows to rigidly connect a rotational stage outside the vacuum environment to the wafer chuck 111 inside the vacuum chamber 110 and the vacuum environment without breaking vacuum and even during stage and chuck rotation. As a result, the vacuum chamber 110 can be maintained at a vacuum pressure when the Z stage 121 moves the wafer 101 in the Z direction and/or when the T stage 123 rotates the wafer 101.

In the example of FIG. 1B, the wafer stage 120 is outside the vacuum chamber 110 and connected to the wafer chuck 111 via the journal bearing 125. In another example (not shown for simplicity purposes), the wafer stage 120 can be installed inside the vacuum chamber 110 so that the journal bearing 125 is no longer needed. That is to say, the vacuum chamber 110 can be expanded to include components (e.g. the Z stage 121, the T stage 123 and the rotary connector 127) in an area 129 excluding the journal bearing 125. Accordingly, the bottom portion 117 of the vacuum chamber 110 is not penetrated, but instead positioned below the Z stage 121, the T stage 123 and the rotary connector 127.

In some embodiments, the optical subsystem can include the light source 103 configured to emit light (represented by dotted lines in FIGS. 1A and 1B; and represented by dotted lines and solid lines in FIG. 2) and the detector 105 configured to detect reflected and/or scattered light. As mentioned earlier, the illumination optics 130 are configured to receive light from the light source 103 and direct the light through the illumination vacuum window 113A to the optical spot 107 on the wafer 101 while the collection optics 140 are configured to receive the light from the optical spot 107 through the collection vacuum window 113B and direct the light to the detector 105. Additionally, the optical subsystem is configured so that the side windows 113 are substantially perpendicular to an optical path of the light and substantially transparent to the light.

The light source 103 can include a single, multi-wavelength or broadband illumination source. In a preferred embodiment, the light source 103 can provide substantial radiation over wavelengths ranging from approximately 200 nm to approximately 800 nm, including the entirety of the visible spectrum in addition to some ultraviolet radiation and infrared radiation. In a non-limiting embodiment, the light source 103 might be a compact laser-driven light source (LDLS), directly coupled to the illumination optics 130. Alternatively, illumination light might be delivered over one or more optical fibers.

The illumination optics 130 can include illumination polarization optics 131. In a preferred embodiment, a Rochon prism linear polarizer (e.g. 131) may be mounted inside the shaft of a high-precision motor so that all illumination light passes through the Rochon prism linear polarizer and separated into two orthogonal polarizations. One of the two orthogonal polarizations is blocked while the other is transmitted thereby creating illumination light of linear polarization rotating in time. Alternatively, one may use a polarizer and compensator configuration to create circular polarizations and otherwise control and change polarization of illumination light in time. The illumination optics 130 can optionally include a reflector 132 as shown in the example of FIG. 1B.

The illumination optics 130 can also include long working distance illumination optics 133 substantially working through a vacuum window (e.g. 113A) to illuminate a sample on the wafer 101 inside the vacuum chamber 110 and create a small optical spot (e.g. 107) on the wafer 101 with the size in a range of 5-100 μm, e.g. 5 μm, 10 μm, 20 μm, 30 μm, 40 μm, 50μ, 60μ, 70μ, 80 μm, 90 μm, 100 μm and any values therebetween. The long working distance illumination optics 133 may be substantially reflective and include an optical objective composed of a pair of off-axis spherical mirrors or a single aspheric mirror.

The illumination optics 130 can further include an illumination corrector lens 135, placed between the optical objective (e.g. 133) and the vacuum window (e.g. 113A). The illumination corrector lens 135 is configured to reduce chromatic aberrations, cancel out distortions (for example caused by the illumination vacuum window 113A), reduce a size of the optical spot 107 and make the illumination optics 130 more compact than without the illumination corrector lens 135.

Additionally, the illumination vacuum window 113A itself may have the capability to perform chromaticity or other optical aberration corrections so that the dependance of the optical illumination spot (e.g. 107) on wavelength is diminished and a substantially broadband light source (e.g. 200-800 nm or a larger range) can be used, while the overall system size is reduced to meet system footprint requirements. Alternatively, the illumination optics 130 can be configured so that the whole illumination path thereof can have the capability to perform chromaticity corrections for a substantially broadband light source (e.g. 200-800 nm or a larger range) to be used. Moreover, the collection vacuum window 113B can be configured to have similar properties to the illumination vacuum window 113A.

Still referring to FIGS. 1A, 1B and 2, the collection optics 140 can include a collection corrector lens 145, placed between the collection vacuum window 113B and a collection objective (e.g. 143). The collection corrector lens 145 is configured to reduce chromatic aberrations, cancel out distortions (for example caused by the collection vacuum window 113B), reduce the size of the optical spot 107 and make the collection optics 140 more compact than without the collection corrector lens 145.

The collection optics 140 can also include long working distance collection optics 143 substantially working through the vacuum window (e.g. 113B) to collect the light that is reflected and/or scattered by the sample (e.g. the wafer 101) and project the light into a spectroscopic detector (e.g. 105). The collection optical path of the collection optics 140 may be substantially reflective and include an optical objective (e.g. 143) composed of a pair of off-axis spherical mirrors or a single aspheric mirror. Note that the illumination objective (e.g. 133) and the collection objective (e.g. 143), when including pairs of off-axis spherical mirrors, may be oriented substantially at 90 degrees with respect to each other, as viewed along the optical path (for example for a chief ray), for purposes of polarization correction.

The collection optics 140 can further include collection polarization optics 141 which can be similar to the illumination polarization optics 131. As such, the descriptions have been provided above and will be omitted herein for brevity purposes. In a preferred embodiment, polarization configuration is fixed, and illumination polarization is changing over time. Alternatively, the illumination polarization is fixed while collection polarization is changing over time.

In some embodiments, the detector 105 is a directly coupled spectrometer capable of analyzing multiple wavelengths over a range of approximately 200 nm to 800 nm. The spectrometer acquisition operations would also be synchronized with changes in polarization configuration of the system 100, such as a rotating polarizer on the illumination side. Alternatively, the detector 105 may be configured to analyze a single wavelength.

Note that the optical module, or rather the detector 105, may include one or multiple measurement channels (or multiple detectors), including any combinations of an oblique incidence spectroscopic ellipsometer, a close-to-normal (e.g. <20° angle-of-incidence) polarized or unpolarized reflectometer, a pattern recognition imaging camera-based channel for wafer navigation and detection of surface-defects, a channel for measurements of non-specular reflections, and the like. The measurement channels above may have co-located or closely-spaced measurement spots.

In some embodiments, the system 100 includes an autofocus sensing subsystem, which may substantially share a main optical path that goes from the light source 103 and then to the wafer 101, and then passes through the collection objective (e.g. 143) and to a beam-splitting element 149 where a portion of collected light can be directed to a (dedicated) autofocus sensor 106. Alternatively, the autofocus sensing subsystem may utilize completely independent illuminator and optical paths. Such an autofocus sensing subsystem can operate together with the Z stage subsystem (e.g. 121), which can move the wafer 101 up and down inside the vacuum with respect to the optical subsystem, while the Z stage 121 itself may be placed outside the vacuum environment and use the journal bearing 125 and the vacuum seal to move the wafer chuck 111 with the wafer 101 on top inside the vacuum environment. The Z stage 121 may be mechanically connected to the T stage 123, with both located outside the vacuum environment and the T stage 123 placed on top of the Z stage 121. The T stage 123 can be mechanically connected to the journal bearing 125 and to the wafer chuck 111 inside the vacuum environment.

As mentioned earlier, the transfer module 150 is configured to move the illumination optics 130 and the collection optics 140 parallel to the illumination vacuum window 113A and the collection vacuum window 113B respectively. Herein, the transfer module 150 can include a common stage with moving transfer and complete optical module mounting thereon. That is, the optical subsystem, which includes the light source 103, the detector 105, the illumination optics 130 and the collection optics 140, can be mounted on the transfer module 150 so that the transfer module 150 is configured to move the light source 103, the detector 105, the illumination optics 130 and the collection optics 140 simultaneously or individually. Note that in order to clearly illustrate other components, only part of the common stage is shown herein. Additionally, the illumination corrector lens 135, the collection corrector lens 145 and the transfer stage 150 can be spaced apart from the vacuum chamber 110. For example, the illumination optics 130 and the collection optics 140 and/or the transfer module 150 can be mounted on a gantry 109 without being in contact with the vacuum chamber 110. Off-axis mirrors (e.g. 133 and 143), the illumination corrector lens 135 and the collection corrector lens 145 can be rigidly attached to a respective objective housing and together form a respective objective assembly, which can be suspended from one or more tracks of the gantry 109.

In some embodiments, the travel range of the transfer module 150 can be substantially similar or slightly larger than the wafer radius, so that together with wafer rotation motion on the rotating stage (e.g. 123) the integrated metrology module (e.g. 100) can measure any location on the wafer 101. In other words, the transfer module 150 can be configured to move the optical spot 107 at least between an edge of the wafer 101 and a center of the wafer 101, for example in a straight path back and forth along a longitudinal direction (e.g. the Y direction) of the side windows 113. Meanwhile, the wafer stage 120 can rotate the wafer 101 around the center of the wafer 101. As a result, all locations of the wafer 101 are accessible by the light or the optical spot 107.

In some embodiments, the system 100 can optionally include a controller 160. Other components of the system 100 can be connected to and controlled by the controller 160 that may optionally be connected to a corresponding memory storage unit and user interface (all not shown). Various characterization operations can be executed via the user interface and stored in a storage unit. Accordingly, the wafer 101 can be characterized with various ellipsometry techniques and models.

In a non-limiting example, the controller 160 is coupled to the wafer stage 120 and the transfer module 150. As a result, the controller 160 is configured to adjust a relative position of the optical spot 107 on the wafer 101 by rotating the wafer 101 via the wafer stage 120, moving the optical spot 107 via the transfer module 150, or a combination thereof. The controller 160 can further be coupled to the autofocus sensor 106 to execute an autofocus process.

It will be recognized that the controller 160 may be coupled to various components of the system 100 to receive inputs from and provide outputs to the components. For example, the controller 160 can be configured to receive data from the detector 105. The controller 160 can also be configured to adjust knobs and control settings for the light source 103, the detector 105, the wafer stage 120, the illumination optics 130 and the collection optics 140 and/or the transfer module 150. Of course the adjustments can be manually made as well.

The controller 160 can be implemented in a wide variety of manners. In one example, the controller 160 is a computer. In another example, the controller 160 includes one or more programmable integrated circuits that are programmed to provide the functionality described herein. For example, one or more processors (e.g. microprocessor, microcontroller, central processing unit, etc.), programmable logic devices (e.g. complex programmable logic device (CPLD)), field programmable gate array (FPGA), etc.), and/or other programmable integrated circuits can be programmed with software or other programming instructions to implement the functionality of a proscribed plasma process recipe. It is further noted that the software or other programming instructions can be stored in one or more non-transitory computer-readable mediums (e.g. memory storage devices, FLASH memory, DRAM memory, reprogrammable storage devices, hard drives, floppy disks, DVDs, CD-ROMs, etc.), and the software or other programming instructions when executed by the programmable integrated circuits cause the programmable integrated circuits to perform the processes, functions, and/or capabilities described herein. Other variations could also be implemented.

Still referring to FIGS. 1A, 1B and 2, it should be understood that not all components described above are necessary for the system 100. Depending on specific needs, the system 100 may include some or all of the components described above. For example, the system 100 may include the vacuum chamber 110, the wafer stage 120, the illumination optics 130, the collection optics 140 and the transfer module 150 while not including the light source 103 and/or the detector 105. A user may then add the light source 103, the detector 105 and/or the controller 160 after building or purchasing the system 100.

Figure 3:
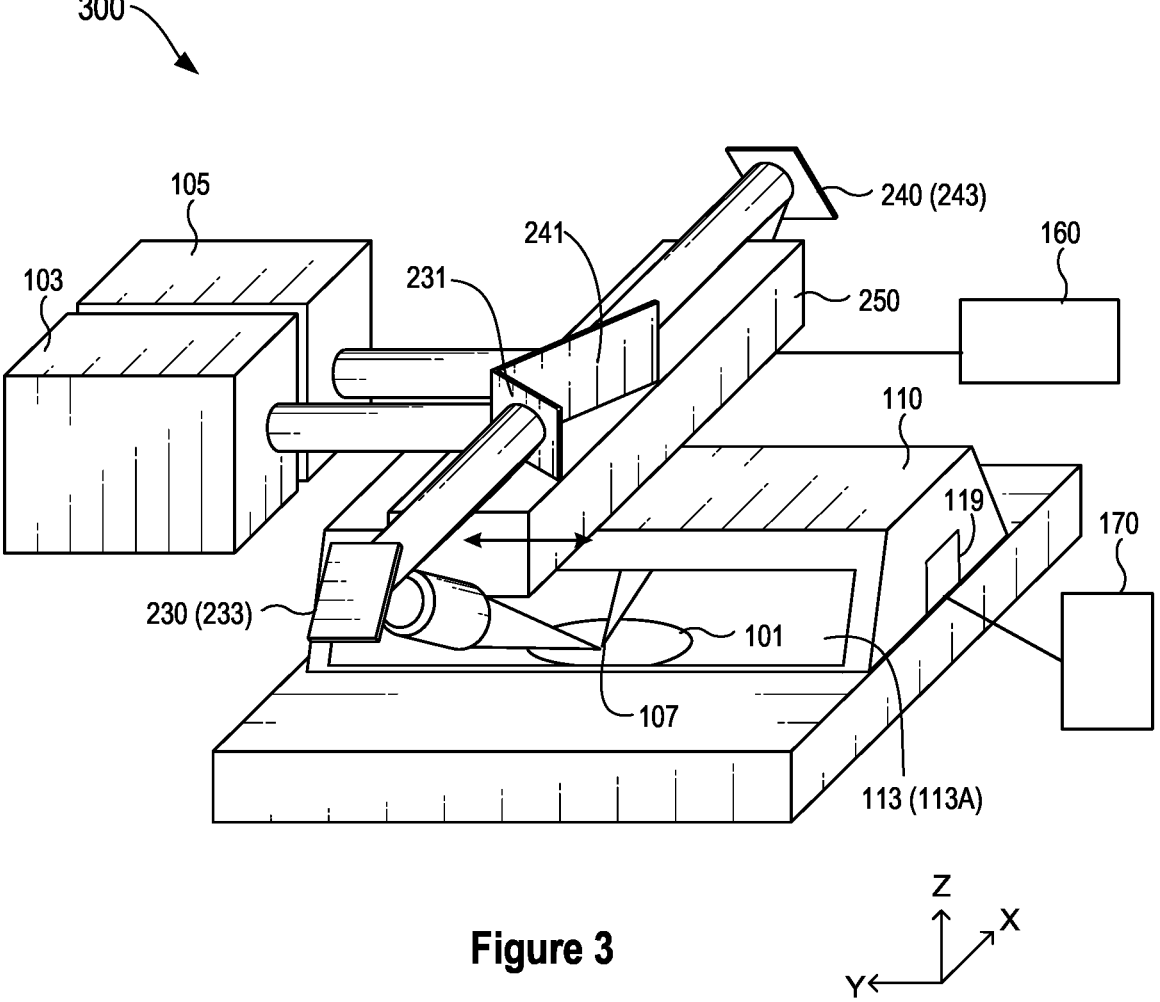
FIG. 3 shows a perspective view of a system in accordance with some embodiments of the present disclosure.

FIG. 3 shows a perspective view of a system 300 in accordance with some embodiments of the present disclosure. As illustrated, the system 300 includes the vacuum chamber 110 having the side windows 113. The system 300 can also include a wafer chuck (e.g. 111) and a wafer stage (e.g. 120) which are not shown herein for simplicity purposes.

The system 300 can further include an optical subsystem having, for example, illumination optics 230 and collection optics 240. The illumination optics 230 are configured to receive light from the light source 103 and direct the light through the illumination vacuum window 113A of the side windows 113 to the optical spot 107 on the wafer 101. The collection optics 240 are configured to receive the light from the optical spot 107 through a collection vacuum window (e.g. 113B; not shown) of the side windows 113 and direct the light to the detector 105.

Specifically, the illumination optics 230 can include a reflector 231 and an optical component 233 which corresponds to the long working distance illumination optics 133. Similarly, the collection optics 240 can include a reflector 241 and an optical component 243 which corresponds to the long working distance collection optics 143. While not shown, it should be understood that the system 300 can include corrector lenses which correspond to the illumination corrector lens 135 and the collection corrector lens 145.

The system 300 can further include a transfer module 250 that is configured to move the illumination optics 230 and the collection optics 240 parallel to the illumination vacuum window 113A and the collection vacuum window respectively. Note that the light source 103 and/or the detector 105 are separated from the transfer module 250 and can be fixably attached to a frame (e.g. the gantry 109 in FIGS. 1A and 1B) or a stage. By contrast, the illumination optics 230 and the collection optics 240 can be mounted on a stage of the transfer module 250 which is configured to move parallel to a longitudinal direction (e.g. the Y direction) of the side windows 113.

The system 300 can further include the controller 160 that is coupled to the wafer stage (e.g. 120; not shown) and the transfer module 250. As a result, the controller 160 is configured to adjust a relative position of the optical spot 107 on the wafer 101 by rotating the wafer 101 via the wafer stage (e.g. 120), moving the optical spot 107 via the transfer module 250, or a combination thereof.

In some embodiments, the system 300 can further include at least one processing chamber 170 that is connected to the vacuum chamber 110 and configured to perform a surface treatment on the wafer 101 in vacuum. Accordingly, the vacuum chamber 110 includes one or more openings 119 (e.g. gates, inlets, outlets, etc.) for the wafer 101 to transfer between the vacuum chamber 110 and the at least one processing chamber 170 under vacuum conditions (i.e. without breaking vacuum during transfer). The at least one processing chamber 170 can perform a surface treatment including, but not limited to, film deposition, etching, lithographic patterning, doping, cleaning, heating, etc. While not shown in FIGS. 1A and 1B for simplicity purposes, it should be understood that the system 100 can also include at least one processing chamber 170 that is connected to the vacuum chamber 110 and configured to perform a surface treatment on the wafer 101 in vacuum.

In a non-limiting example, the at least one processing chamber 170 includes a plasma processing chamber. The at least one processing chamber 170 may be a capacitively-coupled plasma processing chamber, inductively-coupled plasma processing chamber, microwave plasma processing chamber, Radial Line Slot Antenna (RLSA™) microwave plasma processing chamber, electron cyclotron resonance (ECR) plasma processing chamber, or other types of processing systems or combination of systems. Thus, it will be recognized by those skilled in the art that the techniques described herein may be utilized with any of a wide variety of plasma processing systems. The plasma chamber can be used for a wide variety of operations including, but not limited to, etching, deposition, cleaning, plasma polymerization, plasma-enhanced chemical vapor deposition (PECVD), atomic layer deposition (ALD), atomic layer etch (ALE), and the like. The structure of a plasma chamber is well known to one skilled in the art. It will be recognized that different and/or additional plasma process systems may be implemented while still taking advantage of the techniques described herein.

FIG. 4 shows a flow chart of a process 400 for characterizing a wafer, in accordance with some embodiments of the present disclosure. At Step S410, light is directed through illumination optics and an illumination vacuum window of a vacuum chamber to an optical spot on a wafer placed on a wafer chuck in the vacuum chamber. The illumination optics include an illumination corrector lens. The illumination vacuum window is slanted relative to the wafer chuck. At Step S420, the light from the optical spot through collection optics and a collection vacuum window of the vacuum chamber is detected. The collection optics include a collection corrector lens. The collection vacuum window is slanted relative to the wafer chuck. At Step S430, a relative position of the optical spot on the wafer is adjusted by rotating the wafer via a wafer stage, moving the optical spot via a transfer module, or a combination thereof. The illumination corrector lens and collection corrector lens are configured to reduce chromatic aberration. The wafer stage is positioned below and mechanically coupled to the wafer chuck and configured to rotate the wafer chuck. The transfer module is configured to move the illumination optics and the collection optics parallel to the illumination vacuum window and the collection vacuum window respectively.

Techniques herein offer several advantages over conventional systems and methods. Firstly, techniques herein enable the integration with a vacuum chamber of long working distance optics with corrector lens on illumination and collection sides, allowing to reduce coma and chromatic aberrations and provide ability to perform polarization measurements and therefore achieve sub-angstrom sensitivity on thin films with a small optical spot (e.g. substantially smaller than 40 μm, preferably smaller than 30 μm, preferably smaller than 20 μm, preferably smaller than 10 μm). Secondly, the wafer handling platform herein (e.g. the wafer chuck 111 and the wafer stage 120) include a wafer on rotating and Z-moving stages while a complete optics module (e.g. 103, 105, 130 and 140) can be mounted on the linear stage (e.g. the transfer module 150) to provide capability to measure any location on a wafer. Thirdly, the optical portion of the system (e.g. 100, 300 and the like) and the transfer module 150 can be flexibly integrated for various design needs. For example, a complete optics module (e.g. 103, 105, 130 and 140) can be mounted on the transfer module 150. Alternatively, the optical portion of the system 300 may have illumination and/or detection modules fixed with only illumination and collection part of the optical train on the moving stage (see e.g. FIG. 3), in which case illumination and detection modules (e.g. 130 and 140) will be free-spaced coupled in collimated space with the moving part of the optical train.

Additionally, the system 100, 300 and the like can be built as a new system to reduce vacuum space to lower the burden on vacuum pumps and reduce pumping time to obtain vacuum. Alternatively, the system 100, 300 and the like can be built on an existing semiconductor tool or apparatus. For example, an existing semiconductor tool may include the vacuum chamber 110 that has limited space and is not big enough for the wafer 101 to move in a horizontal direction (e.g. the X and Y direction). The transfer module 150 and the wafer stage 120 (and optionally the journal bearing 125) can resolve this problem and enable measurements of all locations of the wafer 101 without having to move the wafer 101 horizontally.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/ or described operations may be omitted in additional embodiments.

"Substrate" or "wafer" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

The substrate can be any suitable substrate, such as a silicon (Si) substrate, a germanium (Ge) substrate, a silicon-germanium (SiGe) substrate, and/or a silicon-on-insulator (SOI) substrate. The substrate may include a semiconductor material, for example, a Group IV semiconductor, a Group III-V compound semiconductor, or a Group II-VI oxide semiconductor. The Group IV semiconductor may include Si, Ge, or SiGe. The substrate may be a bulk wafer or an epitaxial layer.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A system, comprising:
a vacuum chamber comprising a wafer chuck therein and side windows slanted relative to the wafer chuck, the wafer chuck configured to receive a wafer,
a wafer stage positioned below and mechanically coupled to the wafer chuck, the wafer stage configured to rotate the wafer chuck and move the wafer chuck in a vertical direction substantially perpendicular to the wafer chuck, wherein the wafer stage is outside the vacuum chamber;
a journal bearing that mechanically connects the wafer stage to the wafer chuck and extends through a bottom portion of the vacuum chamber with a vacuum seal;
illumination optics configured to receive light from a light source and direct the light through an illumination vacuum window of the side windows to an optical spot on the wafer, the illumination optics comprising an illumination corrector lens;
collection optics configured to receive the light from the optical spot through a collection vacuum window of the side windows and direct the light to a detector, the collection optics comprising a collection corrector lens; and
a transfer module configured to move the illumination optics and the collection optics parallel to the illumination vacuum window and the collection vacuum window respectively,
wherein the illumination corrector lens and the collection corrector lens are configured to reduce optical aberrations.

2. The system of claim 1, wherein the wafer stage is configured to rotate the wafer chuck and move the wafer chuck in the vertical direction without moving the wafer in a horizontal direction parallel to the wafer chuck.

3. The system of claim 1, wherein the illumination optics and the collection optics are mounted on the transfer module that is configured to move the illumination optics and the collection optics simultaneously.

4. The system of claim 3, wherein the light source and the detector are mounted on the transfer module that is configured to move the light source, the detector, the illumination optics and the collection optics simultaneously.

5. The system of claim 3, wherein the light source and the detector are separate from the transfer module and configured to be stationary when the transfer module moves the illumination optics and the collection optics.

6. The system of claim 1, wherein the illumination optics and the collection optics are outside the vacuum chamber.

7. The system of claim 6, wherein the illumination corrector lens and the collection corrector lens are spaced apart from the vacuum chamber.

8. The system of claim 7, wherein the illumination optics further comprise a polarizer and an optical objective selected from the group consisting of a single aspheric mirror and a pair of off-axis spherical mirrors.

9. The system of claim 1, wherein the transfer module is configured to move the optical spot at least between an edge of the wafer and a center of the wafer.

10. The system of claim 9, further comprising a controller configured to adjust a relative position of the optical spot on the wafer by rotating the wafer via the wafer stage, moving the optical spot via the transfer module, or a combination thereof.

11. The system of claim 9, wherein:
the transfer module comprises a stage on which the illumination optics and the collection optics are mounted, and
the stage is configured to move parallel to a longitudinal direction of the side windows.

12. The system of claim 1, wherein the side windows are substantially perpendicular to an optical path of the light and substantially transparent to the light.

13. The system of claim 1, wherein the detector is a spectrometer.

14. The system of claim 1, wherein the detector, the illumination optics and the collection optics are configured as an ellipsometer.

15. The system of claim 14, wherein the ellipsometer is configured as a spectroscopic ellipsometer having rotating polarizers.

16. The system of claim 1, further comprising a processing chamber connected to the vacuum chamber and configured to perform a surface treatment on the wafer in vacuum.

17. The system of claim 1, wherein the transfer module comprises slanted portions positioned on the side windows.

18. The system of claim 17, wherein the illumination corrector lens and the collection corrector lens are positioned on the slanted portions of the transfer module.

19. The system of claim 1, wherein:
the wafer stage comprises a rotational stage outside the vacuum chamber, and
the journal bearing connects the rotational stage outside the vacuum chamber to the wafer chuck inside the vacuum chamber.

20. A method of wafer characterization, the method comprising:
directing light through illumination optics and an illumination vacuum window of a vacuum chamber to an optical spot on a wafer placed on a wafer chuck in the vacuum chamber, the illumination optics comprising an illumination corrector lens, the illumination vacuum window being slanted relative to the wafer chuck;

detecting the light from the optical spot through collection optics and a collection vacuum window of the vacuum chamber, the collection optics comprising a collection corrector lens, the collection vacuum window being slanted relative to the wafer chuck; and adjusting a relative position of the optical spot on the wafer by rotating the wafer via a wafer stage, moving the optical spot via a transfer module, or a combination thereof, wherein the illumination corrector lens and the collection corrector lens are configured to reduce chromatic aberration, the wafer stage is positioned below and mechanically coupled to the wafer chuck and configured to rotate the wafer chuck, and the transfer module is configured to move the illumination optics and the collection optics parallel to the illumination vacuum window and the collection vacuum window respectively, wherein the wafer stage, the illumination optics and the collection optics are outside the vacuum chamber, wherein the wafer stage and the wafer chuck are mechanically connected via a journal bearing that extends through a bottom portion of the vacuum chamber with a vacuum seal.

\* \* \* \* \*